United States Patent
Lutze et al.

(10) Patent No.: US 7,183,153 B2
(45) Date of Patent: Feb. 27, 2007

(54) METHOD OF MANUFACTURING SELF ALIGNED NON-VOLATILE MEMORY CELLS

(75) Inventors: Jeffrey W. Lutze, San Jose, CA (US); Tuan Pham, San Jose, CA (US); Masaaki Higashitani, Cupertino, CA (US)

(73) Assignee: SanDisk Corporation, Milpitas, CA (US)

( * ) Notice: Subject to any disclaimer, the term of this patent is extended or adjusted under 35 U.S.C. 154(b) by 31 days.

(21) Appl. No.: 10/799,060

(22) Filed: Mar. 12, 2004

(65) Prior Publication Data

US 2005/0199939 A1    Sep. 15, 2005

(51) Int. Cl.
    *H01L 21/8238*    (2006.01)
(52) U.S. Cl. .................. 438/201; 438/255; 438/257; 438/258; 438/259; 438/266; 438/267
(58) Field of Classification Search ................ 438/257, 438/255, 258, 259, 266, 267
    See application file for complete search history.

(56) References Cited

U.S. PATENT DOCUMENTS

| | | | |
|---|---|---|---|
| 5,043,940 A | 8/1991 | Harari |
| 5,070,032 A | 12/1991 | Yuan |
| 5,095,344 A | 3/1992 | Harari |
| 5,168,465 A | 12/1992 | Harari |
| 5,172,338 A | 12/1992 | Mehrotra |
| 5,198,380 A | 3/1993 | Harari |
| 5,268,318 A | 12/1993 | Harari |
| 5,268,319 A | 12/1993 | Harari |
| 5,297,148 A | 3/1994 | Harari et al. |
| 5,313,421 A | 5/1994 | Guterman |
| 5,315,541 A | 5/1994 | Harari et al. |
| 5,343,063 A | 8/1994 | Yuan |
| 5,380,672 A | 1/1995 | Yuan |
| 5,389,808 A | 2/1995 | Arai |
| 5,459,091 A | 10/1995 | Hwang |
| 5,512,505 A | 4/1996 | Yuan |
| 5,534,456 A | 7/1996 | Yuan |
| 5,554,553 A | 9/1996 | Harari |
| 5,554,563 A | 9/1996 | Chu et al. |
| 5,579,259 A | 11/1996 | Samachisa |
| 5,595,924 A | 1/1997 | Yuan |
| 5,640,032 A | 6/1997 | Tomioka |
| 5,654,217 A | 8/1997 | Yuan |
| 5,661,053 A | 8/1997 | Yuan |

(Continued)

FOREIGN PATENT DOCUMENTS

DE    196 17 632    8/2001

(Continued)

OTHER PUBLICATIONS

Aritome, Seiichi, "Advanced Flash Memory Technology and Trends for File Storage Application," IEDM Technical Digest, International Electronic Devices Meeting, IEEE, San Francisco, California, Dec. 10-13, 2000, pp. 33.1.1-33.1.4.

(Continued)

*Primary Examiner*—Dung A. Le
(74) *Attorney, Agent, or Firm*—Parsons Hsue & de Runtz LLP

(57) ABSTRACT

A method of forming an array of non-volatile memory cells includes forming a plurality of floating gate structures and shaping the plurality of floating gate structures to reduce the width of upper parts of floating gate structures. A first process forms floating gates by etching an upper portion of a polysilicon structure with masking elements in place to shape the floating gate. A second process etches recesses and protrusions in a polysilicon structure prior to etching the structure to form individual floating gates.

17 Claims, 14 Drawing Sheets

U.S. PATENT DOCUMENTS

| | | | |
|---|---|---|---|
| 5,677,872 A | 10/1997 | Samachisa | |
| 5,712,179 A | 1/1998 | Yuan | |
| 5,712,180 A | 1/1998 | Guterman et al. | |
| 5,747,359 A | 5/1998 | Yuan | |
| 5,756,385 A | 5/1998 | Yuan | |
| 5,786,988 A | 7/1998 | Harari | |
| 5,817,580 A | 10/1998 | Violette | |
| 5,847,425 A | 12/1998 | Yuan | |
| 5,867,429 A | 2/1999 | Chen | |
| 5,883,409 A | 3/1999 | Guterman | |
| 5,923,976 A | 7/1999 | Kim | |
| 5,965,913 A | 10/1999 | Yuan | |
| 5,966,618 A | 10/1999 | Sun et al. | |
| 5,981,335 A | 11/1999 | Chi | |
| 5,999,448 A | 12/1999 | Kurihara | |
| 6,028,336 A | 2/2000 | Yuan | |
| 6,046,935 A | 4/2000 | Takeuchi et al. | |
| 6,060,360 A | 5/2000 | Lin et al. | |
| 6,103,573 A | 8/2000 | Harari | |
| 6,151,248 A | 11/2000 | Harari | |
| 6,172,395 B1 | 1/2001 | Chen et al. | |
| 6,184,093 B1 | 2/2001 | Sung | |
| 6,208,545 B1 | 3/2001 | Leedy | |
| 6,222,762 B1 | 4/2001 | Guterman et al. | |
| 6,235,586 B1 | 5/2001 | Au | |
| 6,258,665 B1 | 7/2001 | Shimizu | |
| 6,281,075 B1 | 8/2001 | Yuan et al. | |
| 6,281,077 B1 * | 8/2001 | Patelmo et al. | 438/258 |
| 6,295,227 B1 | 9/2001 | Sakui et al. | |
| 6,297,097 B1 | 10/2001 | Jeong | |
| 6,326,263 B1 | 12/2001 | Hsieh | |
| 6,365,525 B2 | 4/2002 | Miller | |
| 6,391,722 B1 | 5/2002 | Koh | |
| 6,417,051 B1 | 7/2002 | Takebuchi | |
| 6,417,538 B1 | 7/2002 | Choi | |
| 6,455,440 B1 | 9/2002 | Jeng | |
| 6,461,973 B1 | 10/2002 | Hui et al. | |
| 6,465,323 B1 | 10/2002 | Yu et al. | |
| 6,512,263 B1 | 1/2003 | Yuan | |
| 6,529,410 B1 | 3/2003 | Han et al. | |
| 6,544,431 B2 | 4/2003 | Gill et al. | |
| 6,548,374 B2 | 4/2003 | Chung | |
| 6,559,008 B2 * | 5/2003 | Rabkin et al. | 438/257 |
| 6,562,682 B1 | 5/2003 | Chiu et al. | |
| 6,614,684 B1 | 9/2003 | Shukuri et al. | |
| 6,620,681 B1 | 9/2003 | Kim et al. | |
| 6,713,834 B2 | 3/2004 | Mori et al. | |
| 6,762,092 B2 | 7/2004 | Yuan | |
| 6,768,161 B2 | 7/2004 | Kinoshita | |
| 6,770,932 B2 | 8/2004 | Himeno et al. | |
| 6,794,708 B2 | 9/2004 | Mori | |
| 6,838,357 B2 | 1/2005 | Chen et al. | |
| 6,844,586 B2 | 1/2005 | Ding | |
| 6,891,246 B2 * | 5/2005 | Aritome | 275/510 |
| 6,894,930 B2 | 5/2005 | Chien et al. | |
| 6,897,524 B2 | 5/2005 | Kamiya | |
| 6,898,121 B2 | 5/2005 | Chien et al. | |
| 7,023,049 B2 | 4/2006 | Takebuchi et al. | |
| 2001/0001491 A1 | 5/2001 | Sakui | |
| 2001/0015454 A1 | 8/2001 | Lee et al. | |
| 2002/0048897 A1 | 4/2002 | Hong | |
| 2002/0072197 A1 | 6/2002 | Kang et al. | |
| 2002/0093073 A1 | 7/2002 | Mori et al. | |
| 2002/0160570 A1 | 10/2002 | Tseng | |
| 2002/0197800 A1 | 12/2002 | Hashimoto et al. | |
| 2003/0015497 A1 | 1/2003 | Gill et al. | |
| 2003/0029839 A1 | 2/2003 | Chou | |
| 2004/0033663 A1 | 2/2004 | Chuang et al. | |
| 2004/0070021 A1 | 4/2004 | Yuan | |
| 2004/0084713 A1 | 5/2004 | Hsieh | |
| 2004/0126972 A1 | 7/2004 | Dong et al. | |
| 2005/0199939 A1 | 9/2005 | Lutze et al. | |

FOREIGN PATENT DOCUMENTS

| | | |
|---|---|---|
| EP | 1274132 | 1/2003 |
| EP | 1363324 | 11/2003 |
| JP | 05190809 | 7/1993 |
| JP | 2001-135736 | 5/2001 |

OTHER PUBLICATIONS

Chan, et al., "A True Single-Transistor Oxide-Nitride-Oxide EEPROM Device," *IEEE Electron Device Letters,* vol. EDL-8, No. 3, Mar. 1987, pp. 93-95.

DiMaria et al., "Electrically-alterable read-only-memory using Si-rich SI0$_2$ injectors and a floating polycrystalline silicon storage layer," *J. Appl. Phys.* 52(7), Jul. 1981, pp. 4825-4842.

Eitan et al., "NROM: A Novel Localized Trapping, 2-Bit Nonvolatile Memory Cell," *IEEE Electron Device Letters,* vol. 21, No. 11, Nov. 2000, pp. 543-545.

Hori et al., "A MOSFET with Si-implanted Gate-SiO$_2$ Insulator for Nonvolatile Memory Applications," IEDM 92, Apr. 1992, pp. 469-472.

Lee, Jae-Duk, et al., "Effects of Parasitic Capacitance on NAND Flash Memory Cell Operation," Non-Volatile Semiconductor Memory Workshop, IEEE, Monterey, California, Aug. 12-16, 2001, pp. 90-92.

Nozaki et al., "A 1-Mb EEPROM with MONOS Memory Cell for Semiconductor Disk Application," *IEEE Journal of Solid State Circuits,* vol. 26, No. 4, Apr. 1991, pp. 497-501.

Takeuchi, Y., et al., "A Self-Aligned STI Process Integration for Low Cost and Highly Reliable 1Gbit Flash Memories," 1998 Symposium on VLSI Technology; Digest of Technical Papers, IEEE, Honolulu, Hawaii, Jun. 9-11, 1998, pp. 102-103.

"Notification of Transmittal of the International Search Report and the Written Opinion of the International Searching Authority, or the Declaration," issued in International Application No. PCT/US2005/007891, mailed Jun. 27, 2005, 15 pages.

Park et al., "8Gb MLC (Multi-Level Cell) NAND Flash Memory Using 63 nm Process Technology", Samsung Electronics Co., Ltd., Semiconductor R & D Center, pp. 1-4.

"Planarized NVRAM Cell with Self-Aligned BL-BL and WL-BL Isolations", IBM Technical Disclosure Bulletin, IBM Corp. New York, US, vol. 36, No. 2, Feb. 1, 1993, pp. 375-377.

\* cited by examiner

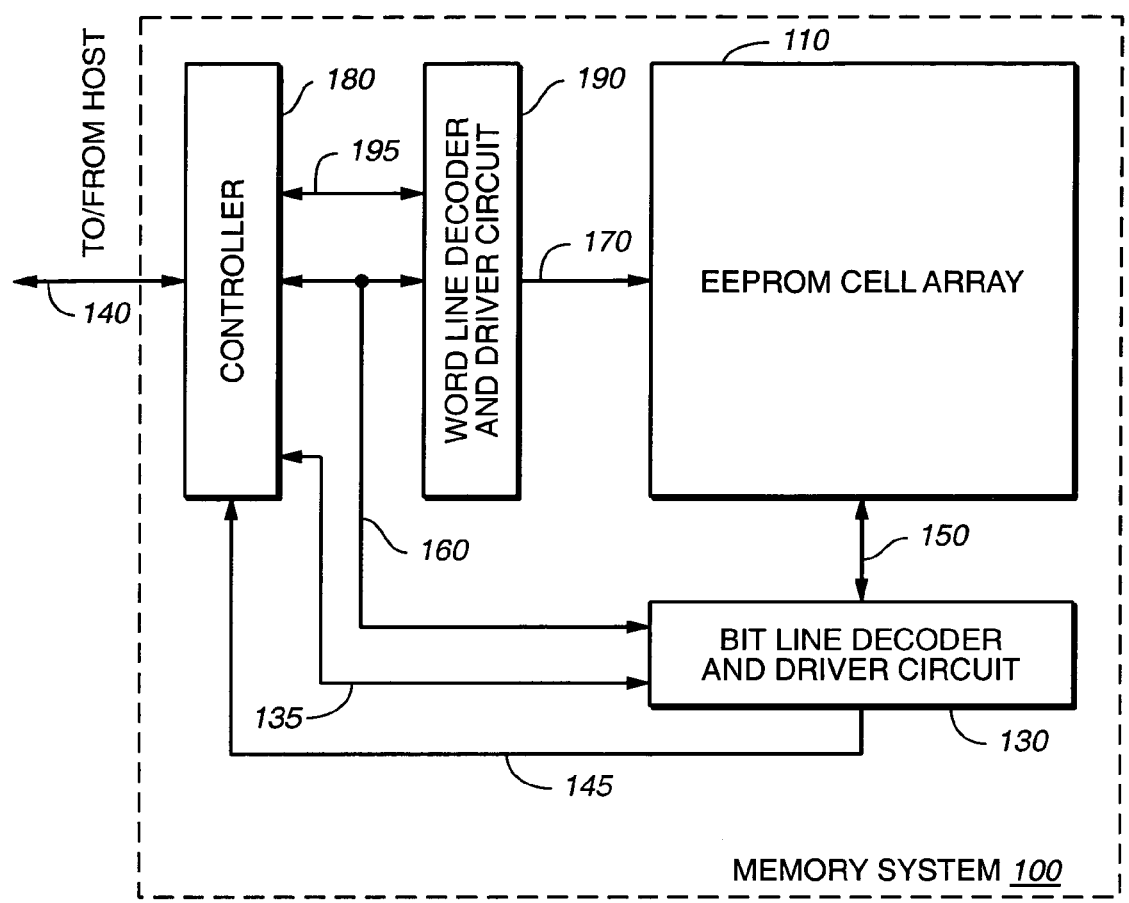
FIG._1

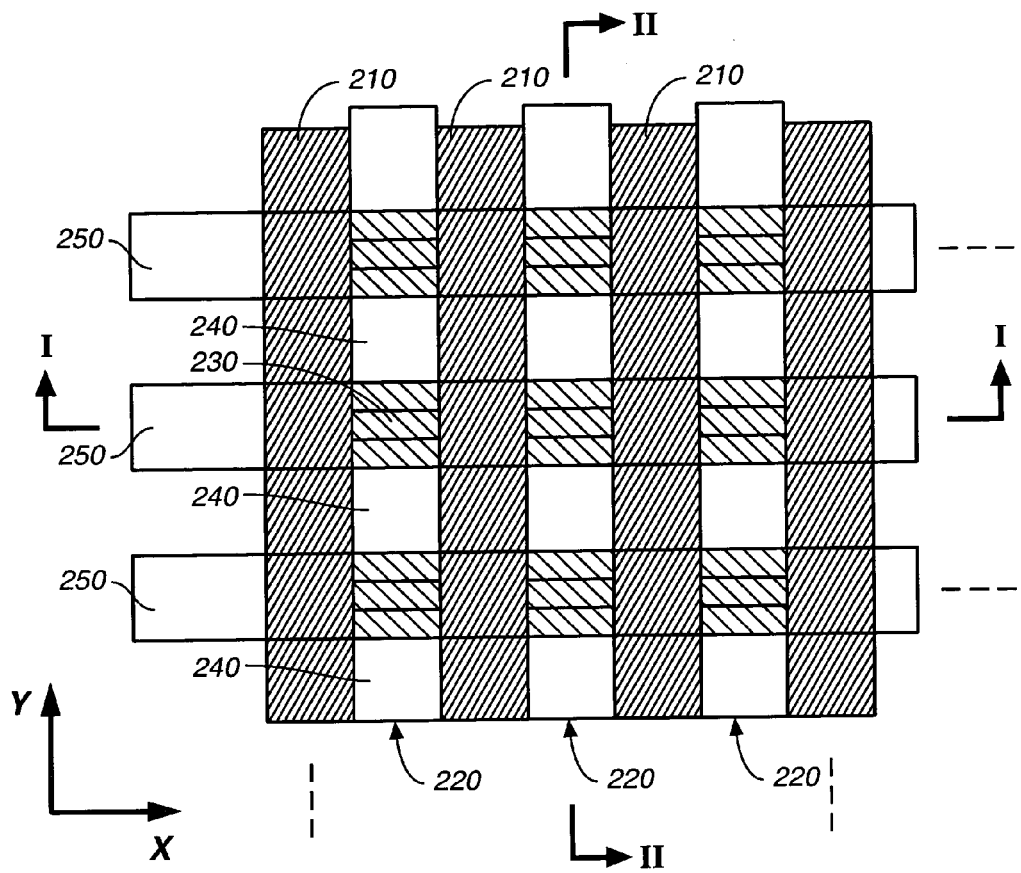
FIG._2A
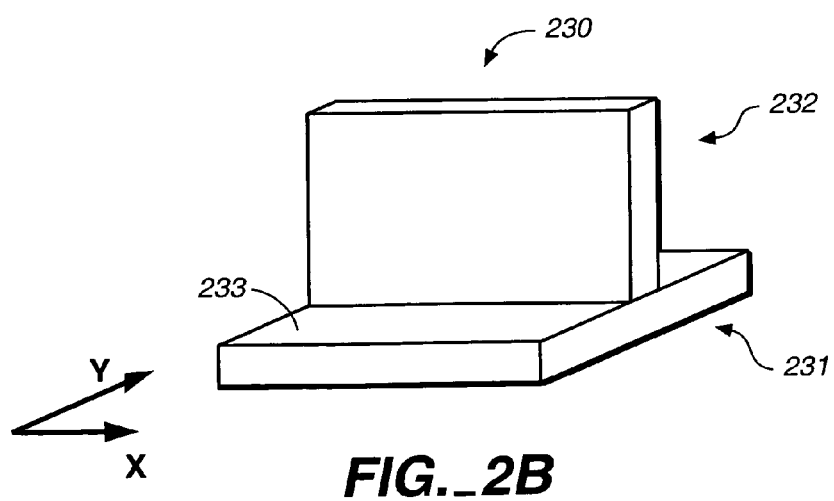
FIG._2B

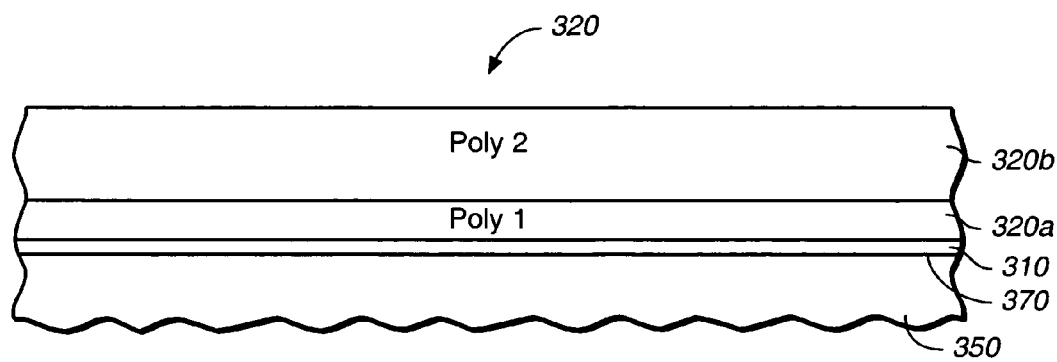
FIG._3A
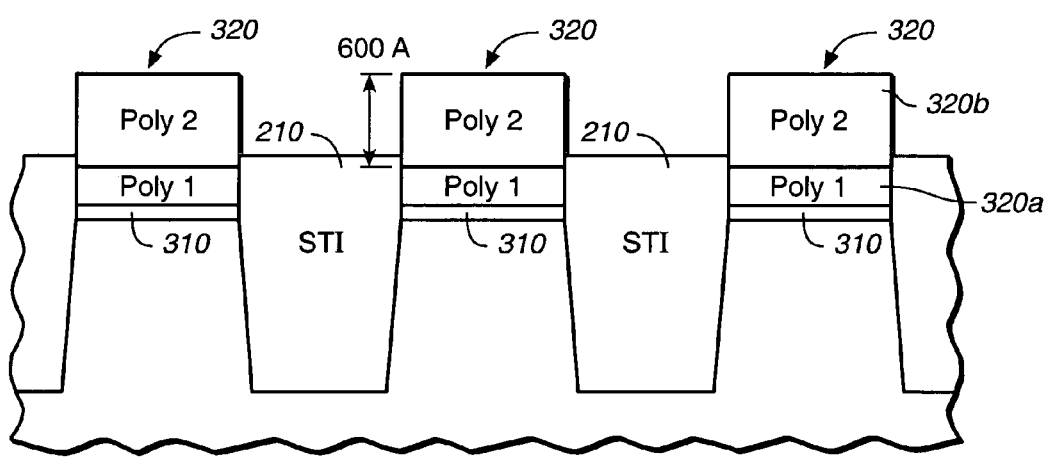
FIG._3B

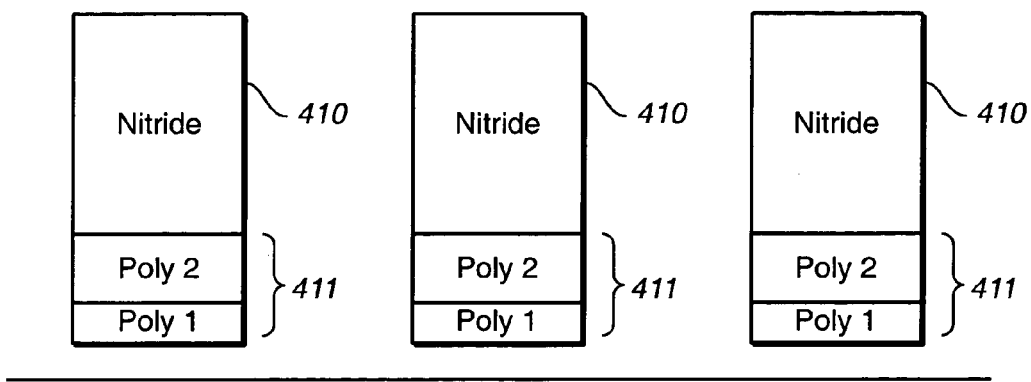
FIG._4A
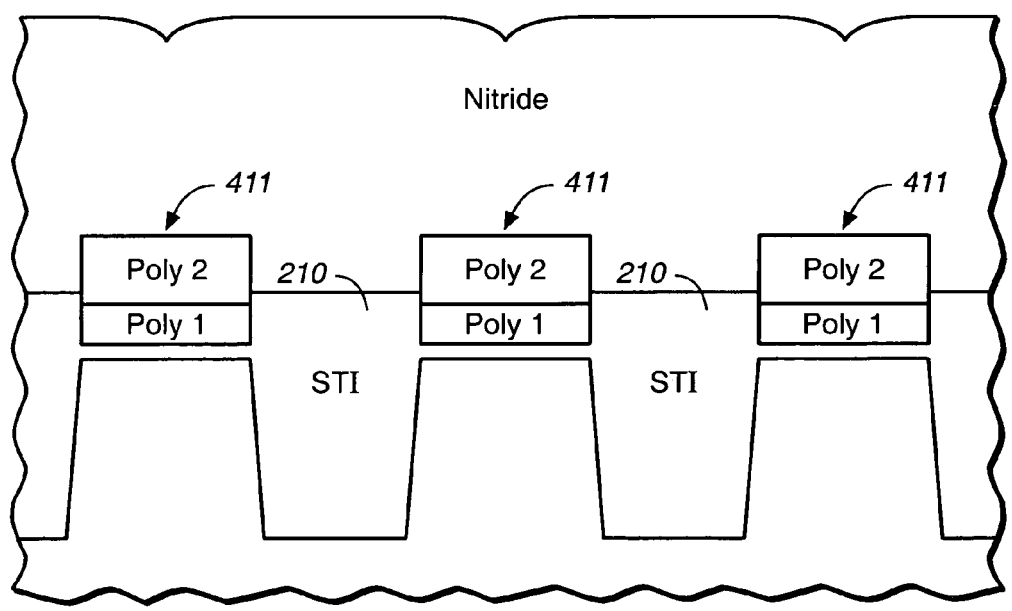
FIG._4B

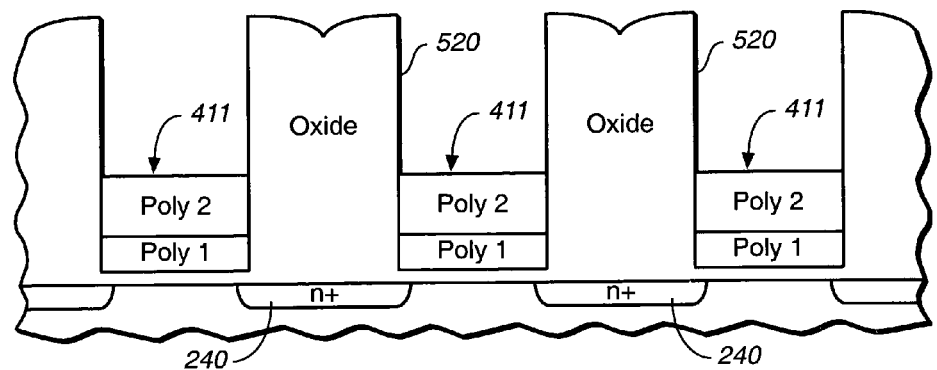
FIG._5A
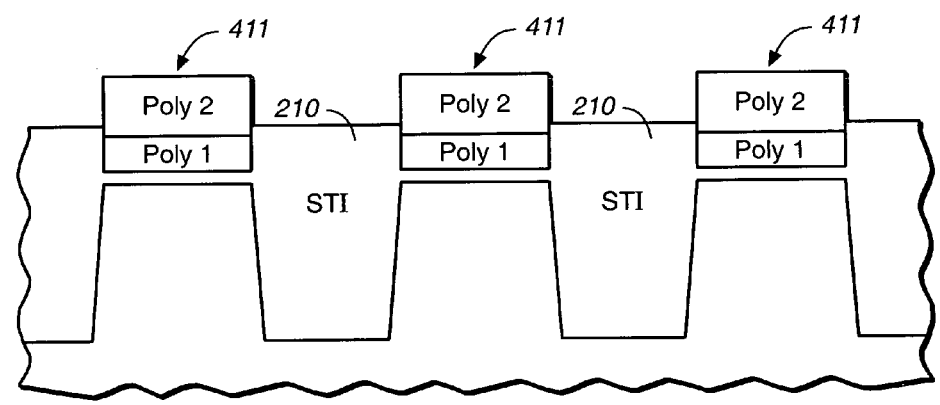
FIG._5B

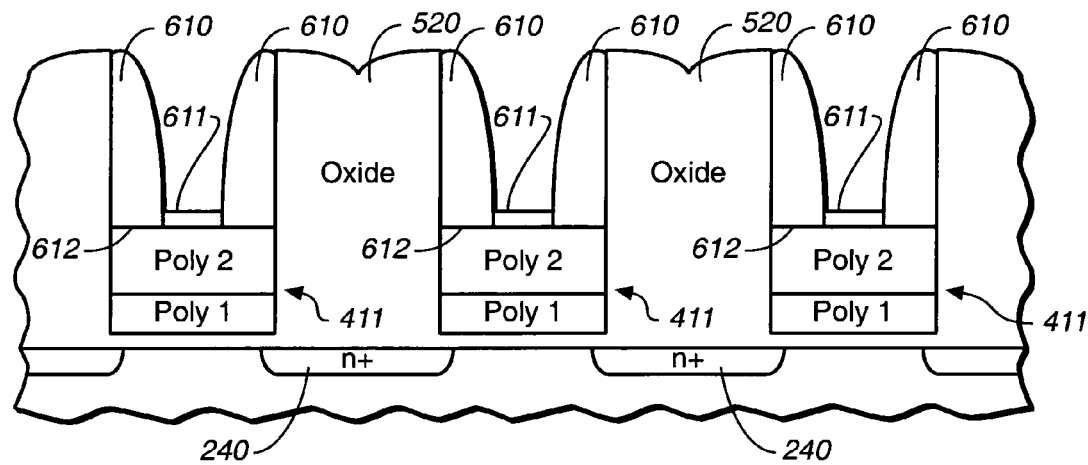
FIG._6A
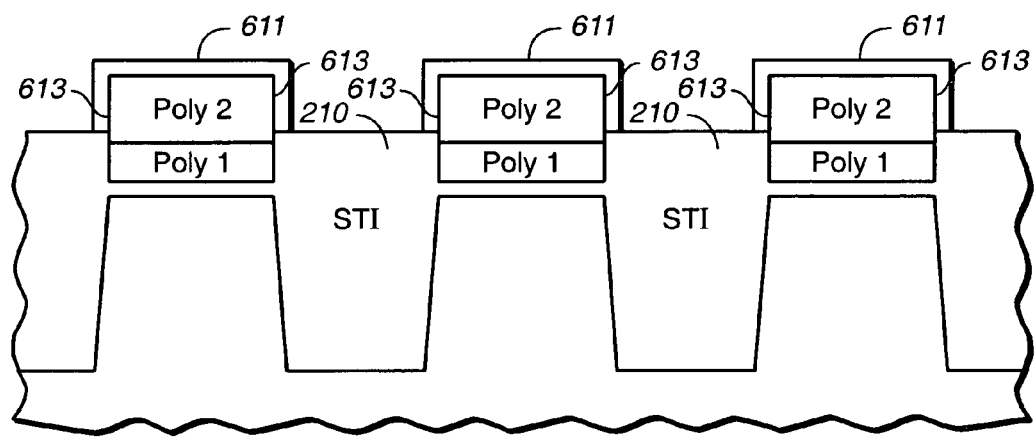
FIG._6B

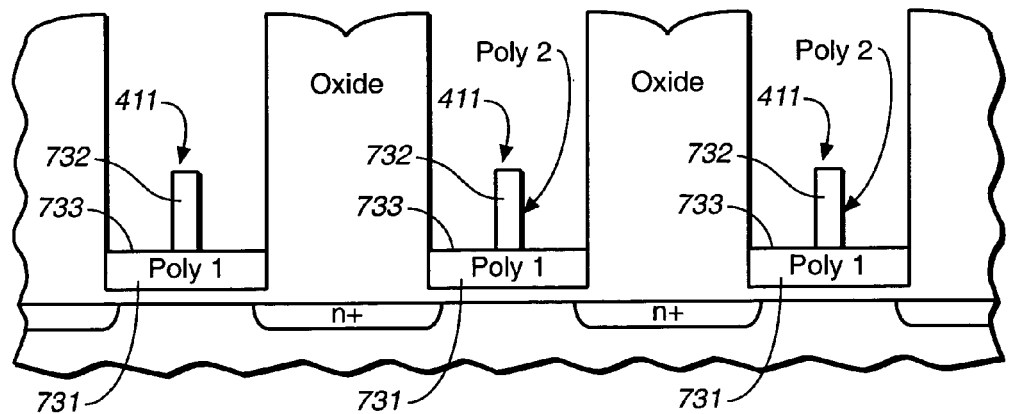
FIG._7A
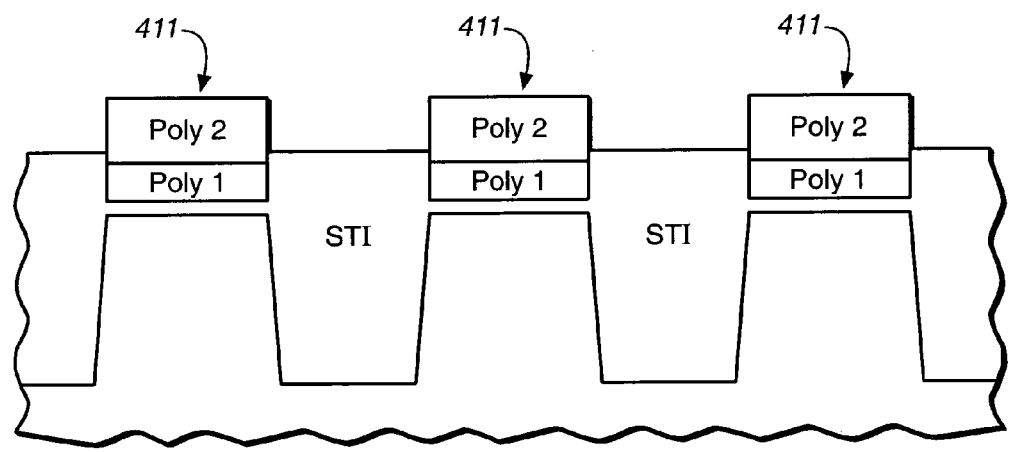
FIG._7B

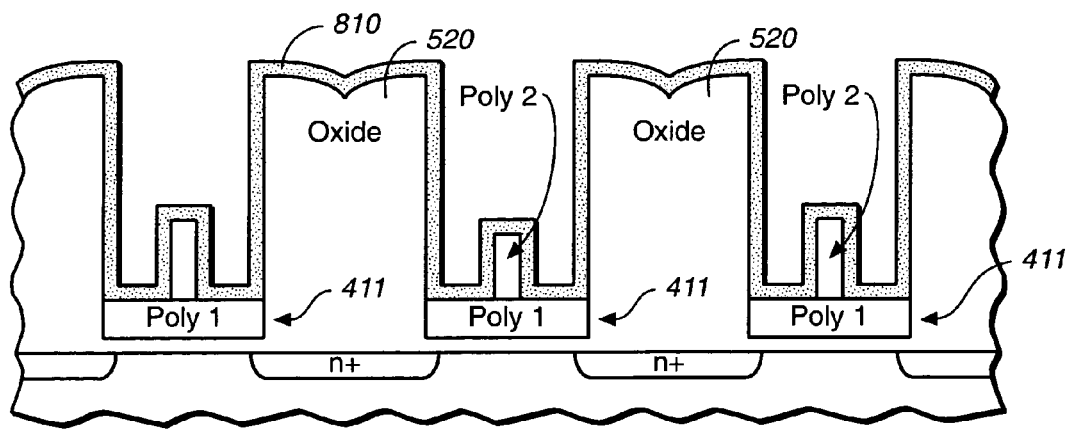
FIG._8A
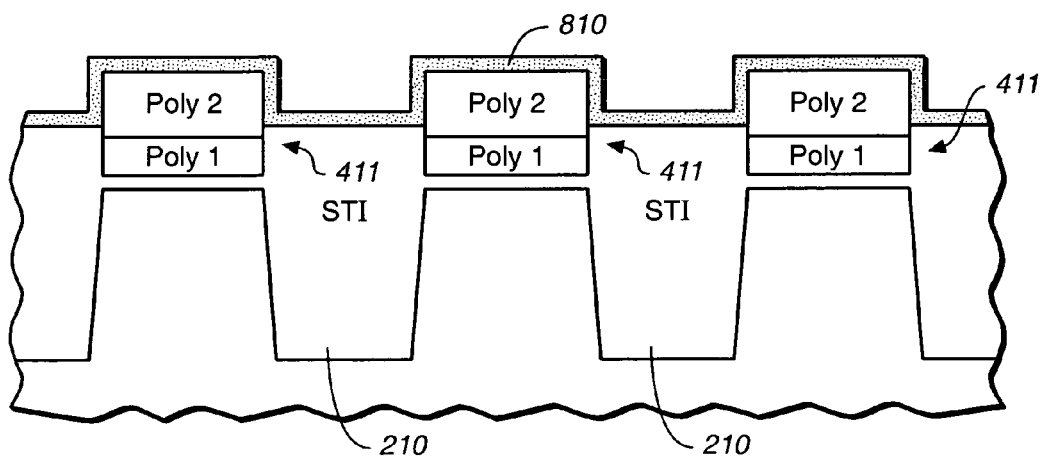
FIG._8B

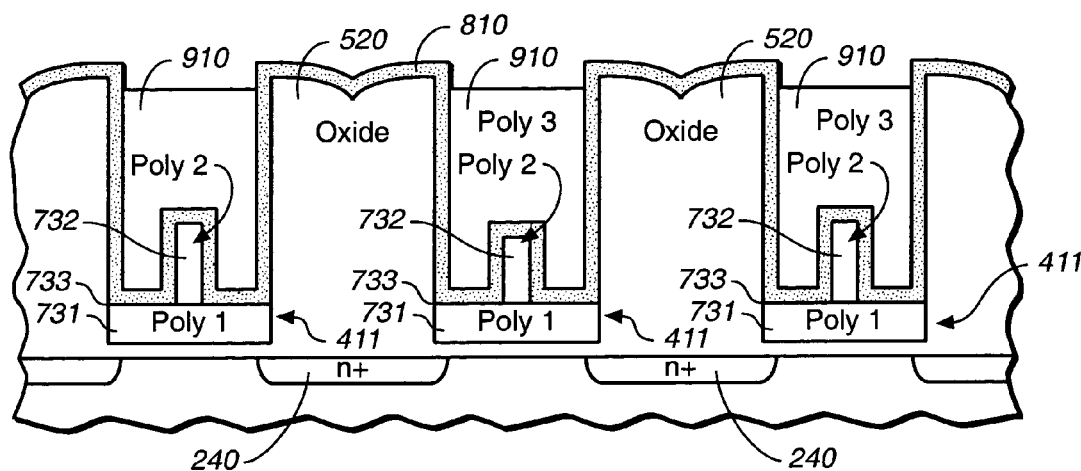
FIG._9A
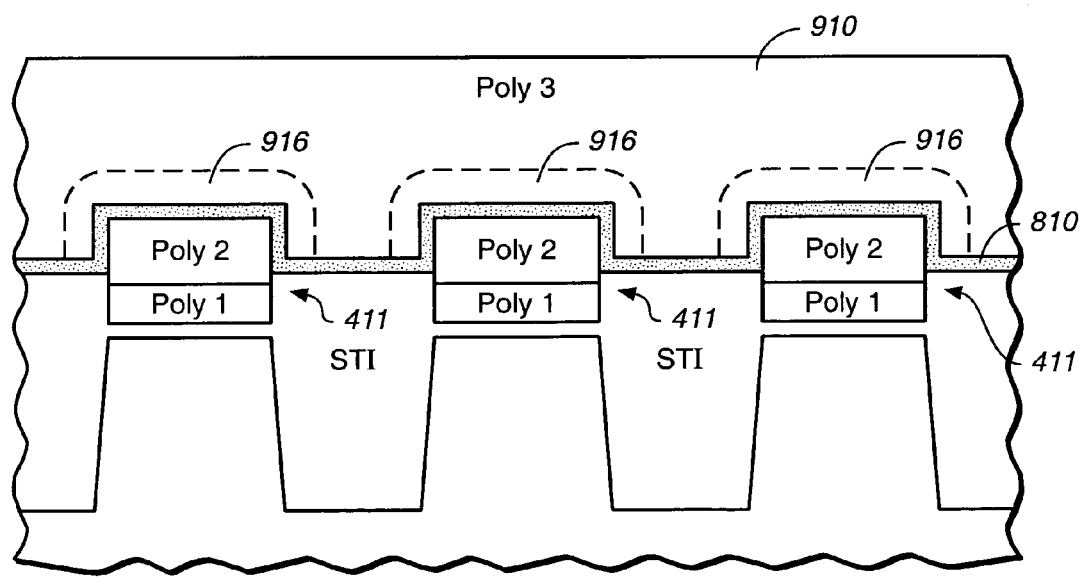
FIG._9B

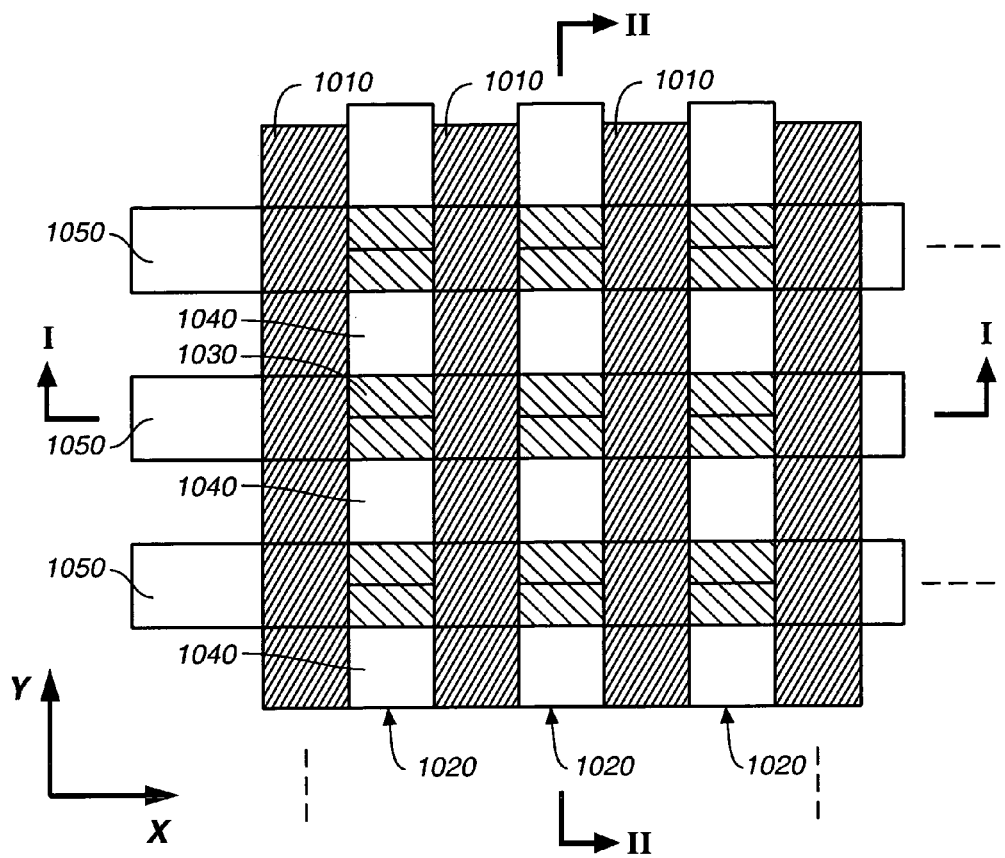
FIG._10A
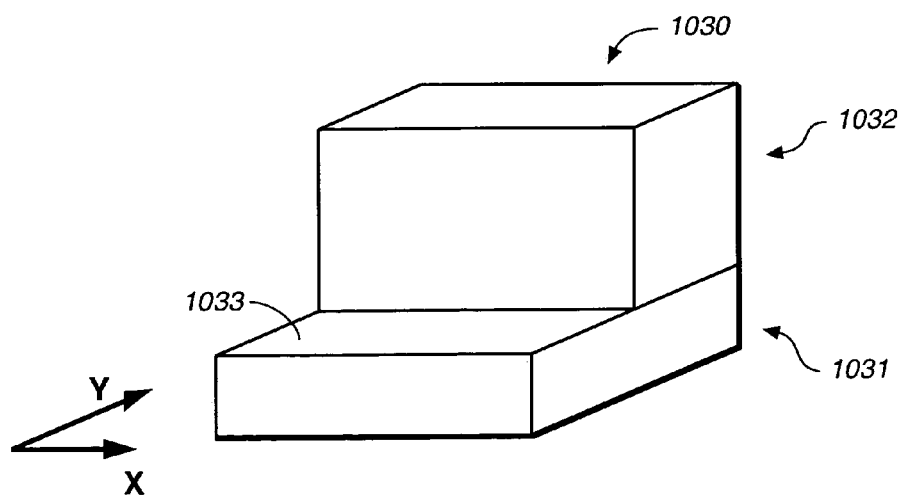
FIG._10B

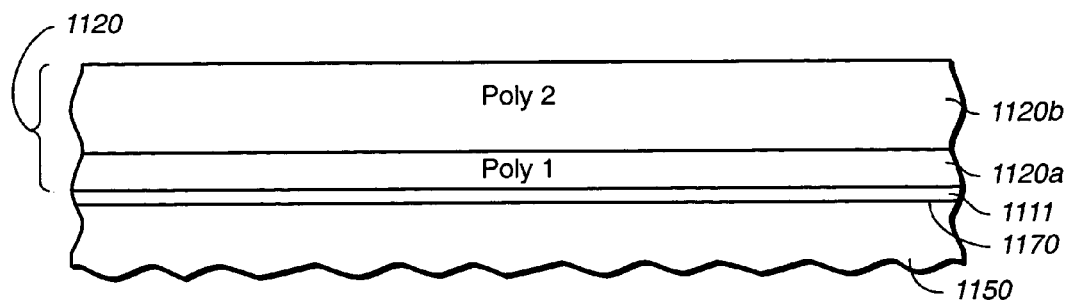
FIG._11A
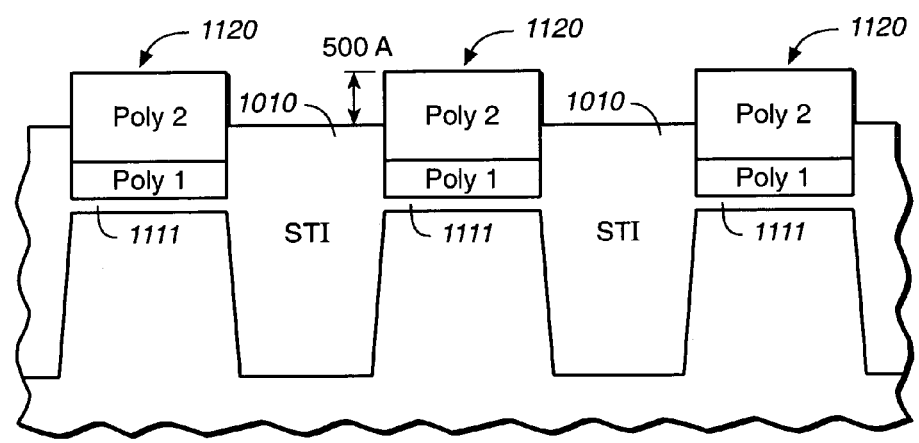
FIG._11B

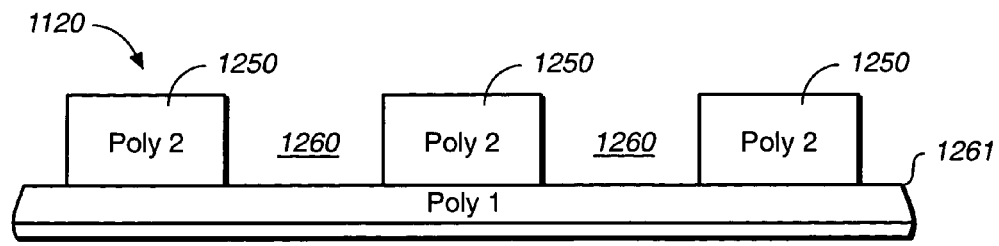
FIG._12A
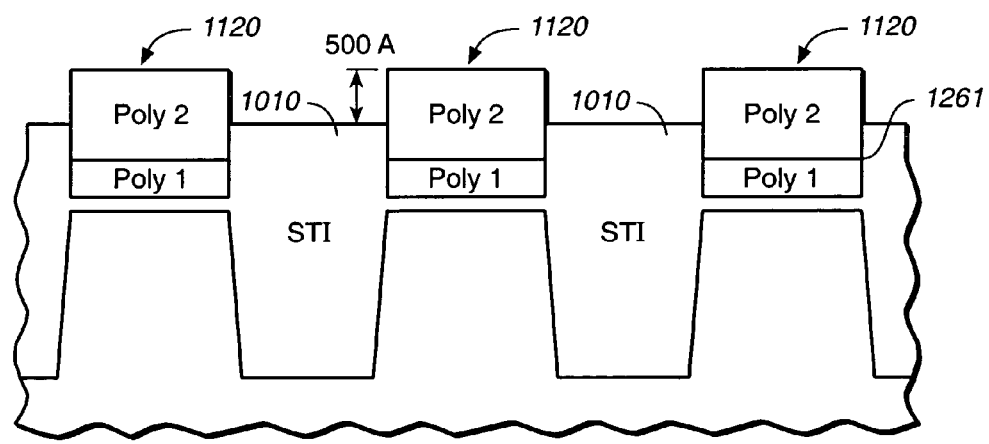
FIG._12B

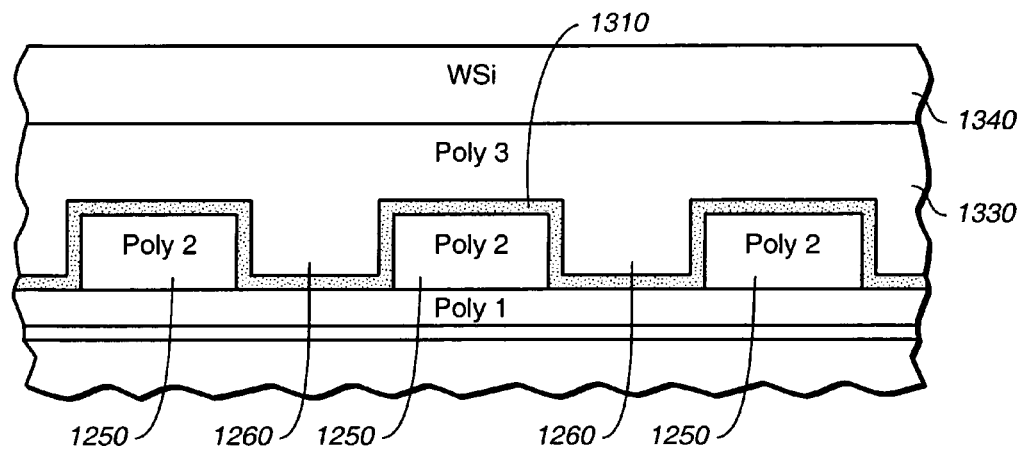
FIG._13A
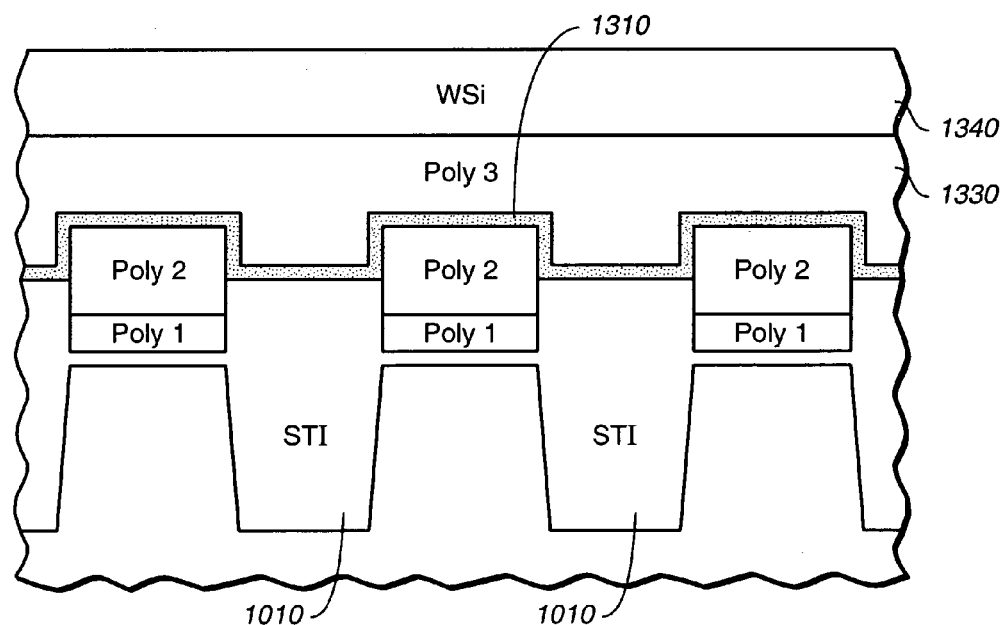
FIG._13B

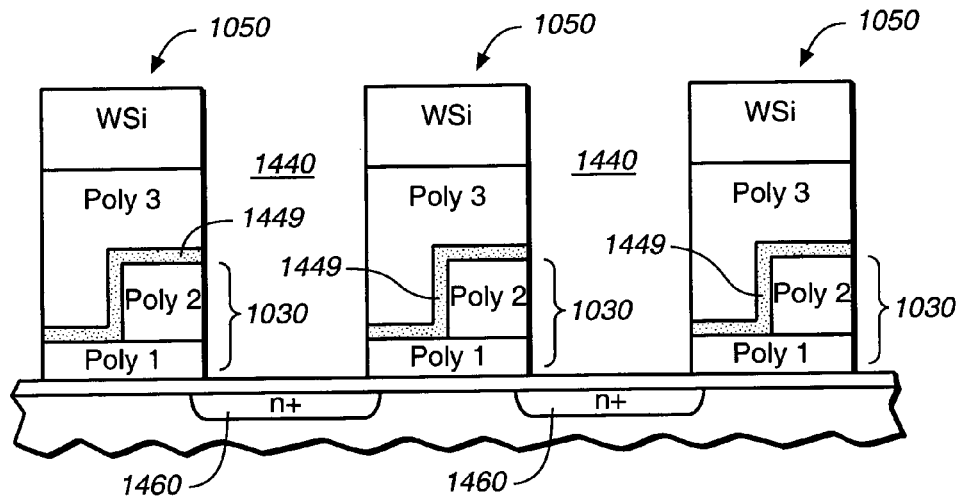
FIG._14A
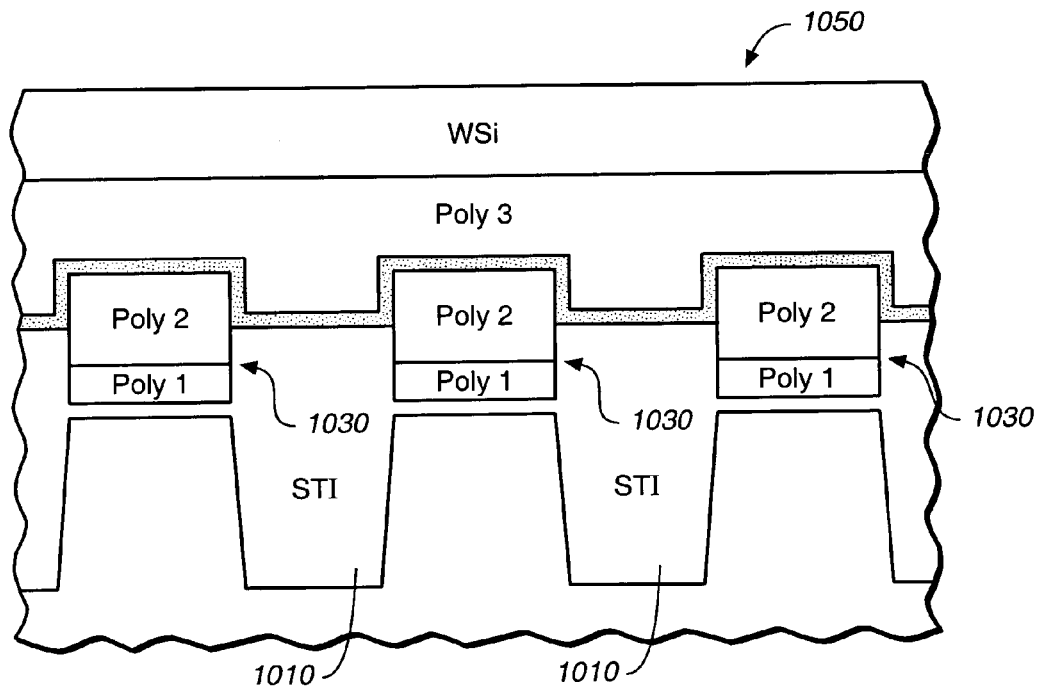
FIG._14B

METHOD OF MANUFACTURING SELF ALIGNED NON-VOLATILE MEMORY CELLS

FIELD OF THE INVENTION

This invention relates generally to non-volatile flash memory systems, and, more specifically, to the structures of memory cells and arrays of memory cells, and to the process of forming them.

BACKGROUND

There are many commercially successful non-volatile memory products being used today, particularly in the form of small form factor cards, which use an array of flash EEPROM (Electrically Erasable and Programmable Read Only Memory) cells. In one type of architecture, a NAND array, a series of strings of more than two memory cells, such as 16 or 32, are connected along with one or more select transistors between individual bit lines and a reference potential to form columns of cells. Word lines extend across cells within a large number of these columns. An individual cell within a column is read and verified during programming by causing the remaining cells in the string to be over driven so that the current flowing through a string is dependent upon the level of charge stored in the addressed cell. An example of a NAND architecture array and its operation as part of a memory system is found in U.S. Pat. No. 6,046,935, which patent is incorporated herein in its entirety by this reference.

In another type of array having a "split-channel" between source and drain diffusions, the floating gate of the cell is positioned over one portion of the channel and the word line (also referred to as a control gate) is positioned over the other channel portion as well as over the floating gate. This effectively forms a cell with two transistors in series, one (the memory transistor) with a combination of the amount of charge on the floating gate and the voltage on the word line controlling the amount of current that can flow through its portion of the channel, and the other (the select transistor) having the word line alone serving as its gate. The word line extends over a row of floating gates. Examples of such cells, their uses in memory systems and methods of manufacturing them are given in U.S. Pat. Nos. 5,070,032, 5,095,344, 5,315,541, 5,343,063, 5,661,053, and 6,281,075, which patents are incorporated herein by this reference.

A modification of this split-channel flash EEPROM cell adds a steering gate positioned between the floating gate and the word line. Each steering gate of an array extends over one column of floating gates, perpendicular to the word line. The effect is to relieve the word line from having to perform two functions at the same time when reading or programming a selected cell. Those two functions are (1) to serve as a gate of a select transistor, thus requiring a proper voltage to turn the select transistor on and off, and (2) to drive the voltage of the floating gate to a desired level through an electric field (capacitive) coupling between the word line and the floating gate. It is often difficult to perform both of these functions in an optimum manner with a single voltage. With the addition of the steering gate, the word line need only perform function (1), while the added steering gate performs function (2). The use of steering gates in a flash EEPROM array is described, for example, in U.S. Pat. Nos. 5,313,421 and 6,222,762, which patents are incorporated herein by this reference.

In any of the types of memory cell arrays described above, the floating gate of a cell is programmed by injecting electrons from the substrate to the floating gate. This is accomplished by having the proper doping in the channel region and applying the proper voltages to the source, drain and remaining gate(s).

Two techniques for removing charge from floating gates to erase memory cells are used in the three types of memory cell arrays described above. One is to erase to the substrate by applying appropriate voltages to the source, drain and other gate(s) that cause electrons to tunnel through a portion of a dielectric layer between the floating gate and the substrate. The other erase technique is to transfer electrons from the floating gate to another gate through a tunnel dielectric layer positioned between them. In the second type of cell described above, a third erase gate is provided for that purpose. In the third type of cell described above, which already has three gates because of the use of a steering gate, the floating gate is erased to the word line, without the necessity to add a fourth gate. Although this latter technique adds back a second function to be performed by the word line, these functions are performed at different times, thus avoiding the necessity of making a compromise because of the two functions. When either erase technique is utilized, a large number of memory cells are grouped together for simultaneously erasure, in a "flash." In one approach, the group includes enough memory cells to store the amount of user data stored in a disk sector, namely 512 bytes, plus some overhead data. In another approach, each group contains enough cells to hold several thousand bytes of user data, equal to many disk sectors' worth of data. Multi-block erasure, defect management and other flash EEPROM system features are described in U.S. Pat. No. 5,297,148, which patent is incorporated herein by this reference.

As in most all integrated circuit applications, the pressure to shrink the silicon substrate area required to implement some integrated circuit function also exists with flash EEPROM systems. It is continually desired to increase the amount of digital data that can be stored in a given area of a silicon substrate, in order to increase the storage capacity of a given size memory card and other types of packages, or to both increase capacity and decrease size. One way to increase the storage density of data is to store more than one bit of data per memory cell. This is accomplished by dividing a window of a floating gate charge level voltage range into more than two states. The use of four such states allows each cell to store two bits of data, eight states stores three bits of data per cell, and so on. A multiple state flash EEPROM structure and operation is described in U.S. Pat. Nos. 5,043,940 and 5,172,338, which patents are incorporated herein by this reference.

Increased data density can also be achieved by reducing the physical size of the memory cells and/or the overall array. Shrinking the size of integrated circuits is commonly performed for all types of circuits as processing techniques improve over time to permit implementing smaller feature sizes. But there are usually limits of how far a given circuit layout can be shrunk in this manner, since there is often at least one feature that is limited as to how much it can be shrunk, thus limiting the amount that the overall layout can be shrunk. When this happens, designers will turn to a new or different layout or architecture of the circuit being implemented in order to reduce the amount of silicon area required to perform its functions. The shrinking of the above-described flash EEPROM integrated circuit systems can reach similar limits.

Another flash EEPROM architecture utilizes a dual floating gate memory cell along with the storage of multiple states on each floating gate. In this type of cell, two floating gates are included over its channel between source and drain diffusions with a select transistor in between them. A steering gate is included along each column of floating gates and a word line is provided thereover along each row of floating gates. When accessing a given floating gate for reading or programming, the steering gate over the other floating gate of the cell containing the floating gate of interest is raised sufficiently high to turn on the channel under the other floating gate no matter what charge level exists on it. This effectively eliminates the other floating gate as a factor in reading or programming the floating gate of interest in the same memory cell. For example, the amount of current flowing through the cell, which can be used to read its state, is then a function of the amount of charge on the floating gate of interest but not of the other floating gate in the same cell. Examples of this cell array architecture and operating techniques are described in U.S. Pat. Nos. 5,712,180, 6,103,573 and 6,151,248, which patents are expressly incorporated herein in their entirety by this reference.

In these and other types of non-volatile memories, the amount of field coupling between the floating gates and the control gates passing over them is carefully controlled. The amount of coupling determines the percentage of a voltage placed on the control gate that is coupled to its floating gates. The percentage coupling is determined by a number of factors including the amount of surface area of the floating gate that overlaps a surface of the control gate. It is often desired to maximize the percentage coupling between the floating and control gates by maximizing the amount of overlapping area. One approach to increasing coupling area is described by Yuan et al in U.S. Pat. No. 5,343,063, which patent is incorporated herein in its entirety by this reference. The approach described in that patent is to make the floating gates thicker than usual to provide large vertical surfaces that may be coupled with the control gates. The approach described in that patent application is to increase coupling between the floating and control gates by adding a vertical projection to the floating gate.

When increasing the vertical coupling areas between adjacent floating and control gates, it is further desirable to do so in a manner that does not increase the area of the substrate that is occupied by each cell. Also, it is preferable to reduce the floating gate to floating gate capacitance.

SUMMARY OF THE INVENTION

A method of forming a non-volatile memory array that has floating gates coupled to control gates, in which the floating gates and control gates have a high coupling ratio and are self aligned, is disclosed. Polysilicon strips are formed between STI regions and are covered with dummy word lines. Polysilicon strips are then etched into separate floating gate structures using the dummy word lines as a masking layer. Dummy word lines are then used to form a second patterned layer having a pattern that is the inverse of the dummy word line pattern and the dummy word lines are removed. Sidewall spacers are formed on the sides of portions of the second patterned layer and masking portions are grown between sidewall spacers. Thus, masking elements are grown over portions of the floating gate structures without requiring alignment. Masking elements are then used to mask portions of the floating gate structures during a polysilicon etch. Floating gate structures are etched to provide an inverted-T shaped floating gate. The upper portion of the floating gate is narrowed in the bit line direction but remains the same in the word line direction. A dielectric layer is deposited over the floating gates. A control gate may then be deposited over the floating gates and may surround the upper portion of the floating gate on four sides and on top and may also overlie the lower portion of the floating gate. This provides a large surface area coupling the control gate and the floating gate. The word line also partially encloses the floating gate and thus reduces electrical coupling between adjacent floating gates. The location of the control gate may be determined by the second patterned layer and is thus self-aligned to the floating gates.

In a second embodiment, a floating gate is formed that is L-shaped in cross section and a control gate is formed in the same step that forms the floating gate so that the two structures are self-aligned. Polysilicon strips are formed as in the first embodiment. Then, a word line mask is used to partially etch portions of the polysilicon strips. Polysilicon strips are not etched through but rather are etched to produce a series of recesses and protrusions. A dielectric layer is then deposited over the patterned strips and another polysilicon layer is deposited over the dielectric layer. A word line mask is then used to pattern both the polysilicon layer and the polysilicon strips. The polysilicon layer is etched to form word lines. The polysilicon strips are etched to form floating gates. The word line mask is positioned so that each floating gate has a portion of a recess and a portion of a protrusion. This provides a large area for electrical coupling between the floating gate and the word line. It also provides shielding between adjacent floating gates.

Additional aspects, advantages and features of the present invention are included in the following description of these detailed examples, which description should be taken in conjunction with the accompanying drawings.

BRIEF DESCRIPTION OF THE DRAWINGS

FIG. 1 illustrates in block diagram form a flash EEPROM system in which the various aspects of the present invention may be implemented.

FIG. 2(A) is a plan view of a floating gate memory cell according to a first embodiment of the present invention.

FIG. 2(B) illustrates a floating gate of the array of FIG. 2(A).

FIG. 3(A) shows a cross-section of the array of FIG. 2(A) along II—II at an intermediate stage of fabrication after polysilicon deposition.

FIG. 3(B) shows a cross-section of the array of FIG. 2(A) along I—I at the same stage of fabrication as 3(A).

FIG. 4(A) shows the same view as in FIG. 3(A) after deposition and etch of silicon nitride.

FIG. 4(B) shows the same view as in FIG. 3(B) after deposition and etch of silicon nitride.

FIG. 5(A) shows the same view as in FIG. 4(A) after deposition of silicon dioxide and removal of silicon nitride.

FIG. 5(B) shows the same view as in FIG. 4(B) after deposition of silicon dioxide and removal of silicon nitride.

FIG. 6(A) shows the same view as in FIG. 5(A) after formation of nitride spacers and oxide portions.

FIG. 6(B) shows the same view as in FIG. 5(B) after formation of nitride spacers and oxide portions.

FIG. 7(A) shows the same view as in FIG. 6(A) after etching of polysilicon and removal of oxide portions.

FIG. 7(B) shows the same view as in FIG. 6(B) after etching of polysilicon and removal of oxide portions.

FIG. 8(A) shows the same view as in FIG. 7(A) after deposition of interpoly dielectric.

FIG. 8(B) shows the same view as in FIG. 7(B) after deposition of interpoly dielectric.

FIG. 9(A) shows the same view as in FIG. 8(A) after deposition of a polysilicon control gate layer.

FIG. 9(B) shows the same view as in FIG. 8(B) after deposition of a polysilicon control gate layer.

FIG. 10(A) shows a plan view of a floating gate memory cell array according to a second embodiment of the present invention.

FIG. 10(B) shows a floating gate of FIG. 10(A)

FIG. 11(A) shows a cross-section of the memory array of FIG. 10(A) at an intermediate stage of fabrication.

FIG. 11(B) shows a cross-section of the memory array of FIG. 11(A) along a plane that is perpendicular to that shown in FIG. 11(A).

FIG. 12(A) shows the same view as FIG. 11(A) after patterning and etching of polysilicon.

FIG. 12(B) shows the same view as FIG. 11(B) after patterning and etching of polysilicon.

FIG. 13(A) shows the same view as in FIG. 12(A) after deposition of an ONO layer, polysilicon layer and WSi layer.

FIG. 13(B) shows the same view as in FIG. 12(B) after deposition of an ONO layer, polysilicon layer and WSi layer.

FIG. 14(A) shows the same view as in FIG. 13(A) after etching to form word lines.

FIG. 14(B) shows the same view as in FIG. 13(B) after etching to form word lines.

DESCRIPTION OF EXEMPLARY EMBODIMENTS

An example of a memory system 100 incorporating the various aspects of the present invention is generally illustrated in the block diagram of FIG. 1. A large number of individually addressable memory cells are arranged in a regular array 110 of rows and columns, although other physical arrangements of cells are certainly possible. Bit lines, designated herein to extend along columns of the array 110 of cells, are electrically connected with a bit line decoder and driver circuit 130 through lines 150. Word lines, which are designated in this description to extend along rows of the array 110 of cells, are electrically connected through lines 170 to a word line decoder and driver circuit 190. Each of the decoders 130 and 190 receives memory cell addresses over a bus 160 from a memory controller 180. The decoder and driving circuits are also connected to the controller 180 over respective control and status signal lines 135 and 195.

The controller 180 is connectable through lines 140 to a host device (not shown). The host may be a personal computer, notebook computer, digital camera, audio player, various other hand held electronic devices, and the like. The memory system 100 of FIG. 1 will commonly be implemented in a card according to one of several existing physical and electrical standards, such as one from the PCMCIA, the CompactFlash™ Association, the MMC™ Association, and others. When in a card format, the lines 140 terminate in a connector on the card that interfaces with a complementary connector of the host device. The electrical interface of many cards follows the ATA standard, wherein the memory system appears to the host as if it was a magnetic disk drive. Other memory card interface standards also exist. As an alternative to the card format, a memory system of the type shown in FIG. 1 may be permanently embedded in the host device.

The decoder and driver circuits 130 and 190 generate appropriate voltages in their respective lines of the array 110, as addressed over the bus 160, according to control signals in respective control and status lines 135 and 195, to execute programming, reading and erasing functions. Any status signals, including voltage levels and other array parameters, are provided by the array 110 to the controller 180 over the same control and status lines 135 and 195. A plurality of sense amplifiers within the circuit 130 receive current or voltage levels that are indicative of the states of addressed memory cells within the array 110, and provides the controller 180 with information about those states over lines 145 during a read operation. A large number of sense amplifiers are usually used in order to be able to read the states of a large number of memory cells in parallel. During reading and program operations, one row of cells is typically addressed at a time through the circuits 190 for accessing a number of cells in the addressed row that are selected by the circuit 130. During an erase operation, all cells in each of many rows are typically addressed together as a block for simultaneous erasure.

A plan view of an example of a NAND memory cell array 110 formed on a silicon substrate is shown in FIG. 2(A), wherein a small part of its repetitive structure of conductive elements is illustrated with little detail of dielectric layers that exist between the elements, for clarity of explanation. Shallow Trench Isolation (STI) regions 210 are formed extending through the surface of the substrate. In order to provide a convention for this description, the STI regions are shown to be spaced apart in a first x-direction, with lengths extending in a second y-direction, these first and second directions being essentially orthogonal with each other.

Between the STI regions 210, there are strings 220 of memory cells running in the y-direction. Thus, the direction of the strings is parallel to the direction of the STI regions. Each string 220 includes many memory devices connected in series. FIG. 2(A) shows portions of three such strings 220 with three memory cells shown for each string. However, strings 220 contain additional cells that are not shown in FIG. 2(A). Also, the array 110 contains additional strings that are not represented in FIG. 2(A). This type of array may have thousands of strings with 16, 32 or more cells in each string.

Each memory cell includes a floating gate 230 and conductive source/drain regions 240 in the substrate adjacent to the floating gate, on either side in the y-direction. Strings are separated by STI regions 210. These STI regions 210 form isolating elements that electrically isolate source/drain regions 240 from source/drain regions 240 of cells in adjacent strings. Along the y-direction source/drain regions 240 are shared by adjacent cells. The source/drain regions 240 electrically connect one cell to the next cell thus forming a string of cells. The source/drain regions 240 in this example are formed by implanting impurities into the substrate in the required areas.

The floating gates 230 shown in the embodiment of FIG. 2(A) comprise two portions that can be better seen in FIG. 2(B). A first floating gate portion 231 is formed from a sheet of polysilicon that extends across the surface of the substrate on a thin silicon dioxide (oxide) layer. A first floating gate portion 231 is similar to a conventional floating gate. The second floating gate portion 232 projects upward from the upper surface 233 of the first floating gate portion 231. In the example shown in FIG. 2(B) the second floating gate portion 232 is a sheet of material that intersects the first floating gate portion 231 at right angles. The second floating gate portion 232 extends to the edges of the first floating gate portion 231 in the x-direction but is much narrower in the y-direction.

Thus, it leaves some of the upper surface 233 of the first floating gate portion 231 exposed.

The first and second floating gate portions 231, 232 of this embodiment are both made of doped polysilicon. Polysilicon could also be deposited in an undoped form and later implanted to form doped polysilicon. Other suitable electrically conductive materials may also be used in place of doped polysilicon. Polysilicon may also be deposited in a single layer instead of two separate layers.

Word lines 250 are shown extending across the array in the x-direction in FIG. 2(A). The word lines 250 overlie portions of the floating gates 230 and also partially surround the floating gates 230. In the embodiment shown, the word lines 250 overlie the exposed parts of the upper surface 233 of the first floating gate portion 231 and enclose the upper surface and the sides of the second floating gate portion 232. The second floating gate portion 232 adds to the surface area of the floating gate that couples the floating gate 230 and the control gate. This increased area provides an improved coupling ratio compared to a conventional floating gate. For example, a floating gate 230 of this embodiment having a first floating gate portion having dimension F in the x and y-directions may give a 25% increase in the area of coupling between the floating gate 230 and the control gate compared to a conventional gate with dimension F in the x and y-directions. This 25% increase in area has been found to result in an 8% increase in coupling ratio between the control gate and the floating gate. The dimension F of the floating gate 230 is generally the minimum feature size for the photolithographic process being used. STI regions 210 and word lines 250 may also have a width of F. Thus, the size of the memory cell is $4F^2$. However, this is not essential. It will be understood that reduced size is generally desirable in devices of this kind but the invention is not limited to any particular size.

Not shown in FIG. 2(A) are metal conductor layers. Since the polysilicon elements usually have a conductivity that is significantly less than that of metal, metal conductors are included in separate layers with connections made to respective metal lines through any intermediate layers at periodical intervals along the lengths of the polysilicon elements. Also, the word line may include a metal or metal-silicide portion to increase the electrical conductivity of the word line. For example, a refractory metal such as Cobalt or Tungsten may be used to form a silicide layer on top of the polysilicon layer. The silicide material has a higher conductivity than the polysilicon and thus improves electrical conduction along the word line.

FIGS. 3(A) and 3(B) show two orthogonal cross-sections of the array of FIG. 2(A) at an intermediate state of array fabrication. FIG. 3(A) shows the view in the y-direction of FIG. 2(A) taken along a section II—II. FIG. 3(B) shows the view in the x-direction, indicated in FIG. 2(A) taken along a section I—I. In FIG. 3(B), the STI regions 210 have been formed and strips of gate dielectric 310 and polysilicon 320 have been formed between them. Polysilicon strips 320 are deposited as two polysilicon layers "Poly 1" 320a and "Poly 2" 320b that extend across the upper surface 370 of substrate 350. However, polysilicon strips 320 may also be deposited in a single deposition step. In the example shown, poly 1 320a is approximately 400A thick and poly 2 320b is approximately 600A thick. Polysilicon strips 320 are later formed into individual floating gate portions. FIG. 3(A) shows a cross-section along one of polysilicon strips 320. FIG. 3(B) gives a view of the same structure at the same stage of fabrication but along a perpendicular direction to that of FIG. 3(A). Three polysilicon strips 320 and the STI regions 210 between them are visible in FIG. 3(B). FIG. 3B shows STI regions after they have been etched back. Initially, STI regions may be higher than shown.

FIGS. 4(A) and 4(B) show the same views as respective FIGS. 3(A) and 3(B) after deposition of a masking material, in this example approximately 2000A of silicon nitride (nitride), followed by patterning and etching steps. The first view of FIG. 4(A) shows the separate silicon nitride portions 410 formed by this step. Also shown are the individual polysilicon floating gate structures 411 formed by the patterning and etching process. Polysilicon and silicon nitride are etched in the same pattern so that each polysilicon floating gate portion 411 has a silicon nitride portion 410 covering it. The silicon nitride portions 410 are strips that extend across the substrate in the x-direction. These silicon nitride strips 410 act as dummy word lines as they are in place of the word lines but are later removed. The polysilicon strips 320 that extended in the y-direction in FIG. 3(A) have been etched in FIG. 4(A) so that only the floating gate structures 411 covered by the silicon nitride portions 410 remain. The silicon nitride portions 410 serve as a mask layer for the subsequent implantation step.

During implantation, source/drain regions 240 are created by implanting impurities into the substrate 350 in the exposed areas. In this example, the only areas that are exposed are the areas between the STI regions 210 that are not covered by the first polysilicon portions 411 and silicon nitride portions 410. Different impurities may be implanted depending on the electrical characteristics required. For example, Arsenic ions may be used to create a region that is doped to be n+.

After the source/drain regions 240 are implanted, approximately 1500 angstroms of silicon dioxide (Oxide) is deposited over the surface of the substrate, filling the areas between the silicon nitride portions 410 and covering over the silicon nitride portions 410. The excess silicon dioxide that is deposited over the silicon nitride portions 410 is removed. For example, the excess silicon dioxide may be etched by a silicon dioxide spacer etch that stops on the silicon nitride. Alternatively, the excess silicon dioxide may be removed by Chemical Mechanical Polishing (CMP). The result of either etching or CMP is a substantially planar surface. Silicon dioxide and silicon nitride portions are both exposed at this surface. The silicon nitride portions are then removed using, for example, a phosphoric acid ($H_3PO_4$) strip. This leaves the structure shown in FIG. 5(A).

FIGS. 5(A) and 5(B) show the same views as previous figures after the implantation step, deposition of silicon dioxide and removal of silicon nitride. The implanted regions 240 extend between floating gate structures 411 in the y-direction. In the x-direction, they extend to the STI regions. The silicon dioxide forms a patterned layer comprising silicon dioxide portions 520, leaving the polysilicon floating gate structures 411 exposed. The silicon dioxide portions 520 form trenches between them with the exposed polysilicon floating gate structures 411 at the bottom of the trenches. The silicon dioxide patterned layer thus formed is self-aligned to the polysilicon floating gate structures 411 because the openings in the patterned layer are determined by the position of floating gate structures 411.

FIGS. 6(A) and 6(B) show the same views as before after a silicon nitride spacer layer has been deposited and etched back to form the spacers 610 shown on the sides of the silicon dioxide portions 520. For example, 500 Angstroms of silicon nitride may be deposited and then a silicon nitride spacer etch could be performed to form an opening in the silicon nitride that exposes a portion of the top surface 612 of floating gate structures 411. A silicon nitride etch may also remove silicon nitride from the side surfaces 613 of floating gate structure 411. Spacers 610 reduce the opening between adjacent silicon dioxide portions 520 to a much narrower gap between spacers 610. An oxidation or deposition step is performed to produce oxide portions 611. Oxide portions 611 are approximately 100A thick and extend along a portion of the top surface 612 and side surfaces 613 of floating gate structures 411. After formation of oxide portions 611, nitride spacers 610 may be removed using a nitride strip with $H_3PO_4$. This leaves top surface 612 and side surfaces 613 of floating gate structure 411 partially exposed where spacers 610 have been removed and partially covered by oxide portions 611. Next, a polysilicon etch is performed with oxide portions 611 in place on floating gate structure 411. The polysilicon etch may be anisotropic so that etching is primarily in the vertical direction. This etches portions of floating gate structure 411 that are not covered by oxide portions 611. Thus, oxide portions 611 act as masking elements during the polysilicon etch step.

FIGS. 7(A) and 7(B) show the same views as before after the polysilicon etch step. Polysilicon has been removed from floating gate structures 411. FIG. 7A shows material removed down to the level of the upper surface 733 of the lower portion 731 of floating gate structure 411 (the interface between Poly 1 and Poly 2). The interface between poly 1 and poly 2 (at upper surface 733) may determine the extent of etching, for example, by incorporating an etch-stop layer at this interface. Alternatively, etching may stop at another level. In some examples there is no interface because there is only one polysilicon layer. Oxide portions 611 have been removed in the view shown in FIG. 7. Typically, oxide portions 611 are removed using dilute, Hydrofluoric Acid (HF) after the etching step is completed. The shape of a floating gate structure 411 at this point is similar to that of floating gate 230 shown in FIG. 2B. Thus, it has a lower portion 731 that extends across the surface of the substrate and an upper portion 732 that extends upwards from the upper surface 733 of lower portion 731. Upper portion 732 is narrower than lower portion 731 in the view of FIG. 7A, that is, in the y-direction.

FIGS. 8(A) and 8(B) show the same views as before after deposition of a dielectric layer 810. Dielectric layer 810 may be an ONO layer. For example, an ONO layer comprised of 50 Angstroms of silicon dioxide, followed by 80 Angstroms of silicon nitride, followed by 50 Angstroms of silicon dioxide may be used. Dielectric layer 810 is deposited to cover all the exposed surfaces shown including the top and sides of silicon dioxide portions 520, STI regions 210 and floating gate structures 411.

FIGS. 9(A) and 9(B) shows the same views as before after word lines 910 are formed. Word lines 910 include a series of conductive gates 916 formed of doped polysilicon in this example. Approximately 1500 Angstroms of polysilicon ("poly 3") is deposited to fill the trenches between silicon dioxide portions 520. The polysilicon of word lines 910 may be etched back or subjected to CMP to remove excess polysilicon. The etch or CMP step removes polysilicon that overlies the silicon dioxide portions 520 and stops upon reaching the silicon dioxide portions 520. Word lines 910 surround the second polysilicon floating gate portions 732 from all four sides and from above. Word lines 910 also overlie parts of upper surface 733 of lower portion 731. Word lines 910 form conductive gates 916 over each floating gate. Conductive gates of word line 910 may be used as control gates for programming and reading the floating gate. Conductive gates 916 of memory cells in a row are connected together by the polysilicon word line 910.

The dielectric layer 810 separates the conductive gates 916 from floating gate structures 411. Because it lies between these two polysilicon layers it is often referred to as "interpoly dielectric." The dielectric layer 810 isolates the control gates and floating gates from direct electrical connection but allows them to be electrically coupled. Each floating gate structure 411 is electrically isolated from the substrate by means of a gate dielectric layer 310, typically silicon dioxide. This electrical isolation allows the floating gate structure 411 to act as a charge storage unit. The thin gate dielectric layer 310 allows charge to enter the floating gate 230 under certain conditions. The presence of charge in the floating gate structure 411 may be detected by its effect on current flowing between the source/drain regions 240. Levels of charge in the floating gate may correspond to logic levels and thus data may be stored in the cell.

If needed, the word line may be made more conductive by adding a metal or a metal-silicide layer on the polysilicon. This may be done by depositing a refractory metal then annealing to form a silicide. For example, Cobalt (Co) may be deposited on Silicon and then annealed to form Cobalt Silicide ($CoSi_2$). A silicide layer may also be formed by Chemical Vapor Deposition (CVD). For example CVD of Tungsten Silicide ($WSi_2$) may be performed.

In a second embodiment shown in FIGS. 10–14, an alternative floating gate structure is formed, using an alternative fabrication method to the one described above with respect to FIGS. 2–9. FIG. 10(A) shows a plan view of a memory array according to the second embodiment. This memory array is similar to that of the first embodiment but has a different floating gate structure and is formed according to a different process. Floating gates 1030 are formed between STI regions 1010, source/drain implant regions 1040 are formed between adjacent floating gates 1030, thus forming strings 1020 of memory cells. Word lines 1050 are formed running perpendicularly to strings 1020 and STI regions 1010.

FIG. 10(B) shows a floating gate 1030 in more detail. Floating gate 1030 is comprised of two portions, a first portion 1031 that extends across the surface of a substrate and a second portion 1032 that forms a projection extending upwards from the upper surface 1033 of the first portion 1031. Part of upper surface 1033 of first portion 1031 is covered by second portion 1032 while part of upper surface 1033 is exposed.

FIGS. 11(A) and 11(B) show two orthogonal cross-sections of an array at an intermediate stage of array fabrication. The views in FIGS. 11(A) and 11(B) are similar to those of FIGS. 3(A) and 3(B). FIG. 11(A) shows the view in the y-direction of FIG. 10(A) taken along a section II—II. FIG. 11(B) shows the view in the x-direction, along I—I in FIG. 10(A). Up to the point shown in FIG. 11, the process may be the same as that of the embodiment of FIG. 3. In FIG. 11(B), the STI regions 1010 have been formed and strips of gate dielectric 1111 and polysilicon 1120 have been formed between STI regions 1010. Polysilicon strips 1120 are deposited as two polysilicon layers "Poly 1" 1120a and "Poly 2" 1120b that extend across the upper surface 1170 of substrate 1150. However, polysilicon strips 1120 may also be deposited in a single deposition step. In the example shown, "poly 1" 1120a is approximately 400A thick and "poly 2" 1120b is approximately 1000A thick. Polysilicon strips 1120 are later formed into individual floating gate portions. FIG. 11(A) shows a cross-section along one of polysilicon strips 1120. FIG. 11(B) gives a view of the same structure at the same stage of fabrication but along a perpendicular direction to that of FIG. 11(A). Three polysilicon strips 1120 and the STI regions 1010 between them are visible in FIG. 11(B). FIG. 11(B) shows STI regions 1010 after they have been etched back so that there is a 500 Angstrom difference in height between the polysilicon strips 1120 and the STI regions 1010. Initially, STI regions may be higher than shown. A mask may be formed over polysilicon strips 1120 so that polysilicon strips 1120 may be etched in a predetermined pattern. The mask used may extend across the substrate in a direction perpendicular to polysilicon strips 1120 and is similar to a mask used to form word lines and is thus considered a word line mask.

FIG. 12 shows poly strips 1120 after etching using a word line mask. FIG. 12(A) shows recesses 1260 that are formed by the etching step. Protrusions 1250 remain between recesses 1260. Recesses 1260 are shown extending down to interface 1261 between "poly 1" 1120a and "poly 2" 1120b. However, recesses may extend to some other level and in some examples poly strips may be deposited in a single layer so that there is no interface between poly 1 and poly 2. The width of protrusions 1250 may be the critical dimension of the patterning process. For example, the width of protrusions 1250 may be 40 nm. The width of recesses 1260 may be similar to that of protrusions 1250, for example 50 nm.

FIG. 13 shows the same structure as before after deposition of ONO, word line poly and word line WSi. ONO layer 1310 is deposited as a blanket layer that covers exposed polysilicon and STI regions 1010 and conforms to the surface features present. ONO layer 1310 covers the exposed surfaces, including the horizontal surfaces on the top of protrusions 1250 and at the bottom of recesses 1260 as well as the sides of protrusions 1250. A third polysilicon layer "poly 3" 1330 is deposited over ONO layer 1310. "Poly 3" 1330 is deposited as a blanket layer that extends into recesses 1260 and covers protrusions 1250 conforming to the ONO layer. Tungsten Silicide (WSi) layer "WSi" 1340 is formed over "poly 3" 1330. WSi may be deposited or may be formed by depositing tungsten over "poly " 1330 and then annealing to form WSi. Cobalt or another refractory metal may also be used in place of tungsten. WSi layer 1340 is deposited as a blanket layer covering "poly 3" 1330. Subsequently, WSi 1340, "poly 3" 1330, ONO 1310 and poly strip 1120 are patterned and etched together.

FIG. 14 shows WSi 1340, "poly 3" 1330, ONO 1310 and poly strip 1120 after etching. A word line mask is used to establish the etch pattern. A word line mask provides alternating masked and unmasked strips that run in the word line direction (perpendicular to STI regions 1010). The mask used may be the same as that used to form protrusions 1250. However, the position of the mask is shifted relative to the position used to form protrusions 1250 so that the etched regions 1440 are not aligned with protrusions 1250. Instead, the position of the mask is shifted by approximately half the width of protrusions 1250 so that an etched region 1440 includes a portion of projection 1250 and a portion of a recess 1260. A series of word lines 1050 is formed by this etching step. Under a word line 1050 is a floating gate 1030. The interface between the word line and the floating gate has a vertical interface portion 1449. This increases the surface area that electrically couples the word line to the floating gate. This also provides shielding between adjacent floating gates because a portion of the control gate is interposed between adjacent floating gates. Source/drain regions 1460 may be formed by implanting impurities between word lines 1050. Thus, word lines 1050 form a mask and the source/drain regions are self-aligned to the word lines.

The process described with respect to FIGS. 11–14 is not completely self-aligned. Word lines 1050 are self-aligned to floating gates 1030 because they are formed by the same etching step. However, an alignment step is used to align the word line mask that defines word lines 1050 to protrusions 1250 and recesses 1260 so that the floating gates that are formed have portions of both protrusions 1250 and recesses 1260. However, precise alignment is not required for this structure. As long as a portion of protrusion 1250 and a portion of recess 1260 are incorporated in a floating gate, an improved structure will result. Misalignment of the order of half the width of protrusions 1250 (20 nm) could result in a floating gate that has no portion of recess 1260 or no portion of protrusion 1250 and thus no vertical surface 1449. However, misalignment of a smaller magnitude may occur without seriously affecting the interface between word line 1050 and floating gate 1030.,The memory cell formed according to this process may have a size of 4F2 where F is the minimum feature size and both word lines 1050 and STI regions 1010 are formed with a width of F.

The above description details particular embodiments of the invention and describes embodiments of the invention using particular array architecture. However, the invention is not limited to the embodiments disclosed or to the particular architecture used in the examples given. It will be understood that the invention is entitled to protection within the full scope of the appended claims.

It is claimed:

1. A method of forming an array of non-volatile memory cells on a semiconductor substrate surface, comprising:
    forming a plurality of shallow trench isolation structures spaced apart across the surface of a substrate in a first direction and extending in a second direction, individual shallow trench isolation structures having sidewalls that extend vertically from the substrate surface;
    forming a plurality of floating gate structures, individual floating gate structures extending between a first sidewall of a first shallow trench isolation structure and a second sidewall of a second shallow trench isolation structure and being bounded in a first direction by the first and second sidewalls; and
    shaping the plurality of floating gate structures to reduce the width in a second direction of an upper part of individual ones of the plurality of floating gate structures.

2. The method of claim 1 further comprising forming a first plurality of masking portions extending in a first direction by the same step used to form the plurality of floating gates, the first plurality of masking portions extending over shallow trench isolation structures and over floating gate structures.

3. The method of claim 2 further comprising forming a second plurality of masking portions having sidewalls in contact with ones of the first plurality of masking portions and subsequently removing the first plurality of masking portions.

4. The method of claim 3 further comprising forming a plurality of sidewall spacers that are in contact with the sidewalls of the second plurality of masking portions and that extend over portions of the floating gate structures.

5. The method of claim 4 further comprising forming a third plurality of masking elements, an individual one of the third plurality of masking elements extending between ones of the plurality of sidewall spacers on a floating gate structure and subsequently removing the plurality of sidewall spacers.

6. The method of claim 5 wherein shaping the plurality of floating gate structures comprises etching the floating gate structures with the plurality of masking elements in place.

7. The method of claim 1 further comprising forming a plurality of control gates that overlie the plurality of floating gate structures.

8. The method of claim 7 wherein a control gate extends on either side of a shaped floating gate structure in the second direction.

9. The method of claim 7 wherein a control gate extends on one side of a shaped floating gate structure in the second direction.

10. The method of claim 7 wherein a control gate extends to enclose the upper part of a floating gate structure on three or four sides and from above.

11. A method of forming an array of non-volatile memory cells on a semiconductor substrate surface, comprising:
    forming a plurality of structures having sidewalls that extend from the substrate surface;
    forming a plurality of conductive strips, an individual conductive strip extending between a first sidewall and a second sidewall of the plurality of structures having sidewalls, an individual conductive strip bounded by the first and second sidewalls;
    forming a plurality of separate floating gate structures by removing portions of the plurality of conductive strips, removed portions extending from a first sidewall to a second sidewall;
    then forming a plurality of masking elements, an individual masking element covering a portion of one of the plurality of floating gate structures; and
    then etching the plurality of floating gate structures to remove portions of the floating gate structures that are not covered by masking elements.

12. The method of claim 11 further comprising etching back the plurality of structures having sidewalls prior to forming a plurality of masking elements.

13. The method of claim 11 wherein the individual masking element extends over part of an upper surface and part of two side surfaces of the one of the plurality of floating gate structures.

14. The method of claim 11 wherein an individual floating gate structure has an upper surface and a lower surface that are parallel to the substrate surface, the removed portions extending from the upper surface to a level that is between the upper surface and the lower surface.

15. A method of forming an array of non-volatile memory cells on a semiconductor substrate surface, comprising:
    forming a first plurality of conductive strips that are separated in a first direction and, extend across the substrate surface in a second direction, an individual conductive strip having a plurality of protrusions extending in a direction away from the substrate surface with recesses between protrusions of the conductive strip;
    forming a dielectric layer overlying the first plurality of conductive strips;
    forming a conductive layer over the dielectric layer;
    etching portions of the conductive layer and the first plurality of conductive strips in the same pattern to form a second plurality of conductive strips from the conductive layer, the second plurality of conductive strips extending in a first direction, and to form a plurality of floating gates from the first plurality of conductive strips, an individual floating gate having at least a portion of a protrusion and at least a portion of a recess, an individual conductive strip overlying the at least a portion of a protrusion and the at least a portion of a recess of a floating gate; and
    wherein a portion of the individual conductive strip extends into the at least a portion of a recess of a floating gate.

16. The method of claim 15 wherein the at least a portion of a protrusion has a surface that extends along a first plane that is perpendicular to the substrate surface, the individual conductive strip has a surface that extends along a plane that is parallel to the first plane and is separated from the first plane by the dielectric layer.

17. The method of claim 15 wherein etching removes half of a protrusion and half of a recess.

* * * * *